United States Patent
Kaewell, Jr.

(10) Patent No.: US 6,953,994 B2
(45) Date of Patent: Oct. 11, 2005

(54) WIRELESS COUPLING OF STAKED DIES WITHIN SYSTEM IN PACKAGE

(75) Inventor: John David Kaewell, Jr., Jamison, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 83 days.

(21) Appl. No.: 10/749,688

(22) Filed: Dec. 31, 2003

(65) Prior Publication Data

US 2005/0073045 A1 Apr. 7, 2005

Related U.S. Application Data

(60) Provisional application No. 60/507,971, filed on Oct. 2, 2003.

(51) Int. Cl.[7] ............................................. H01L 23/34
(52) U.S. Cl. ..................... 257/724; 257/686; 257/687; 257/777
(58) Field of Search ............................. 257/724–727, 257/686–688, 777–779; 438/106–108, 109–110

(56) References Cited

U.S. PATENT DOCUMENTS

| | | | |
|---|---|---|---|
| 5,012,323 A | 4/1991 | Farnworth | |
| 5,593,927 A | 1/1997 | Farnworth et al. | |
| 6,169,329 B1 | 1/2001 | Farnworth et al. | |
| 6,207,474 B1 | 3/2001 | King et al. | |
| 6,376,909 B1 | 4/2002 | Forbes et al. | |
| 6,682,955 B2 | 1/2004 | Cobbley et al. | |
| 6,706,557 B2 | 3/2004 | Koopmans | |
| 2002/0079567 A1 * | 6/2002 | Lo et al. | 257/685 |
| 2004/0084766 A1 * | 5/2004 | Shieh et al. | 257/724 |
| 2004/0104462 A1 * | 6/2004 | Tao et al. | 257/686 |
| 2004/0155327 A1 * | 8/2004 | Cobbley et al. | 257/686 |

OTHER PUBLICATIONS

Gahagan et al., "RF (Gigahertz) ATE Production Testing On–Wafer: Options and Tradeoffs," IEEE, 1999 International Test Conference.

Stoukatch et al., "High Density 3–D Stack Structure for Sip Solutions," IMEC, Kapeldreef 75, 3001 Leuven, Belguim, Internet: http://www.imec.be.

Simon et al., "Interconnects and Transitions in Multilayer LTCC Multichip Modules for 24 GHz ISM–Band Applications," IEEE International Microwave Symposium (IMS–2000), Jun. 2000, pp. 1047–1050.

* cited by examiner

Primary Examiner—Hoai Pham
Assistant Examiner—Nathan W. Ha
(74) Attorney, Agent, or Firm—Volpe and Koenig, PC

(57) ABSTRACT

A multi-chip module (MCM) includes a plurality of semiconductor dies within a single package. RF transceivers on two or more of the dies provide inter-chip communications between the dies permitting the establishment of communications without requiring that hardwire connections be established for each signal connection.

4 Claims, 1 Drawing Sheet

WIRELESS COUPLING OF STAKED DIES WITHIN SYSTEM IN PACKAGE

CROSS REFERENCE TO RELATED APPLICATION(S)

This application claims priority from U.S. Provisional Patent Application No. 60/507,971, filed Oct. 2, 2003, which is incorporated herein by reference.

FIELD OF INVENTION

The present invention relates to semiconductor packaging and to stacked semiconductors. More particularly the invention relates to the interconnection of semiconductor dies in a stacked relationship, either within a single package or in discreet packages in a stacked or closely adjacent configuration.

BACKGROUND

One of the problems with stacked semiconductor dies is a requirement for interconnection. Typically such interconnection is achieved by wirebonding, because techniques used for direct bondpad-to-leadframe connections, such as flip chip and bump connections, are difficult to achieve in the situation of multiple dies. In addition, if a multi-chip module (MCM) is to be pre-characterized and tested, dies which are inoperative must be disconnected and then re-connected to the package substrate. In addition, the transfer of data at high speeds creates problems with respect to lead wires, in that the lead wires tend to have significant inductance, particularly at high frequencies. Accordingly, it is desired to provide a multi-chip module (MCM) in which communication is effected in a manner which bypasses the requirement for lead wires.

Another problem with stacked dies is that, if it is desired to communicate between the dies, then some form of a connection must be made between the dies. There are two ways to accomplish this: 1) direct interconnection from one die to another die; and 2) connection from one die to a lead frame or a connection on a package substrate and a second connection from the lead frame or substrate to a second die. In the case of a direct connection, it becomes necessary to provide wirebonding from die to die. In the case of an interconnection through the lead frame or substrate, a double connection is required, thereby a creating a potential for more signal loss. Accordingly, it is desired to provide a signal communications system for semiconductors in which multiple semiconductors in a vertically spaced relationship or in a closely-spaced relationship are able to communicate. It is further desired to reduce the number of internal connections for a semiconductor package, and if possible, not greatly exceed the lead count for the package.

SUMMARY

In accordance with the present invention, semiconductor dies which are closely positioned are provided with an RF link in order to effect communications between the dies. In the case of stacked semiconductor dies, in which multiple dies are stacked within a single package, RF communication is established between the dies. This permits communications between the dies in the package to be effected without wirebond connections between the dies, or with a reduced number of wirebond connections between dies.

In another aspect of the invention, multiple dies in a single package are provided with RF transceivers and communications between the dies are effected through RF links through the transceivers. This configuration can be used for either stacked or planar multi-chip modules, thereby reducing the number of physical signal connections between dies.

In yet another aspect of the invention, the RF transceivers are used to establish links between dies which are either within a single package or within separate packages. This enables the use of multiple semiconductor dies in a manner which reduces a necessity for physical connections between the dies.

DETAILED DESCRIPTION OF THE PREFERRED EMBODIMENTS

Figure 1:
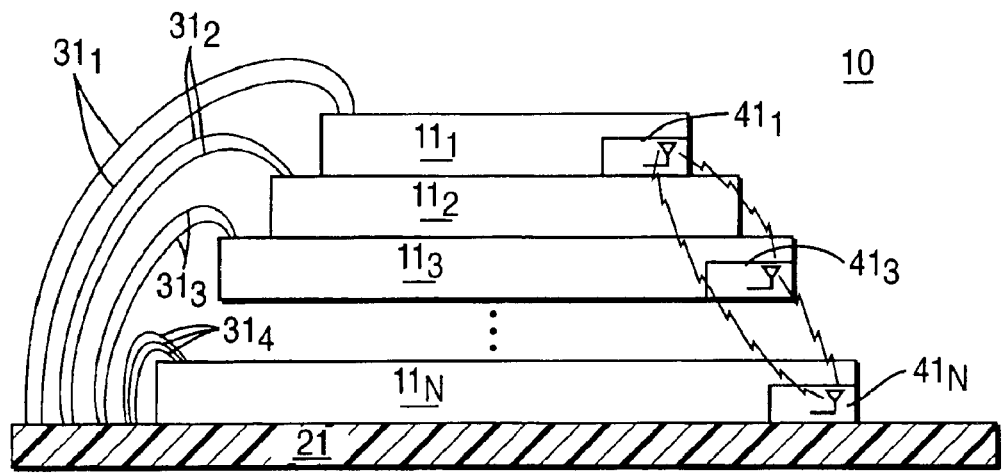
FIG. 1 is a side view of a stacked semiconductor package, schematically showing the use of RF transceivers to establish communication links between stacked dies.

FIG. 1 is a side view of a multi-chip module 10 in which a plurality of dies $11_1$, $11_2$, $11_3$, $11_N$ are shown in a stacked relationship. The bottom of the die $11_N$ is shown as mounted on a package substrate 21. As depicted, the specific number, N, of dies $11_1$, $11_2$, $11_3$, $11_N$ can vary. Although, the stacking of the dies $11_1$, $11_2$, $11_3$, $11_N$ is shown as precluding mounting more than one of the dies $11_1$, $11_2$, $11_3$, $11_N$ directly on the same package substrate 21. In other embodiments, multiple dies can be stacked directly on the substrate 21. A plurality of wirebond connections $31_1$, $31_2$, $31_3$, $31_N$ are shown, in which the stacked dies $11_1$, $11_2$, $11_3$, $11_N$ are wire connected to the package substrate 21. The wirebond connections $31_1$, $31_2$, $31_3$, $31_N$ are established at some point during assembly, so that if for some reason one of the dies $11_1$, $11_2$, $11_3$, $11_N$ is changed, the wirebonding must be re-executed.

Some dies $11_1$, $11_3$, $11_N$ include an RF transceiver $41_1$, $41_3$, $41_N$. For simplicity, the transceivers $41_1$, $41_3$, $41_N$ are depicted on an opposite side of each die $11_1$, $11_2$, $11_3$, $11_N$ from the bond pads. In practice, typically, the transceivers $41_1$, $41_3$, $41_N$ will be on a surface of each die $11_1$, $11_2$, $11_3$, $11_N$ adjacent to the bondpads as well as separate from the bondpads. As illustratively shown, not all the dies $11_2$ may include RF transceivers.

The RF transceivers $41_1$, $41_3$, $41_N$ are capable of RF communication with closely adjacent transceivers, such as the other transceivers $41_1$, $41_3$, $41_N$ on the nearby dies $11_1$, $11_3$, $11_N$. The transceivers $41_1$, $41_3$, $41_N$ include modulator/demodulator circuits, which facilitate communications between the dies $11_1$, $11_3$, $11_N$.

In the configuration shown, the bottom die $11_N$, while equipped with RF transceiver $41_N$, is not able to communicate with the package substrate 21 by use of RF transmissions, although in other embodiments the substrate may have the RF transceiver or both may have the transceiver. Conveniently as shown, this die $11_N$ is mounted adjacent to the substrate 21 and is able to use hardwire connections for communications with the substrate 21. Such hardwire connections can be the wirebond connections $31_1$, $31_2$, $31_3$, $31_N$ shown, or can be any other convenient form of connection. In the case of the communication between the substrate 21 and the adjacent die $11_N$ being hardwired connections, the RF transceivers $41_1$, $41_3$, $41_N$ are used to establish further communication links with other dies $11_1$, $11_3$, $11_N$.

Figure 2:
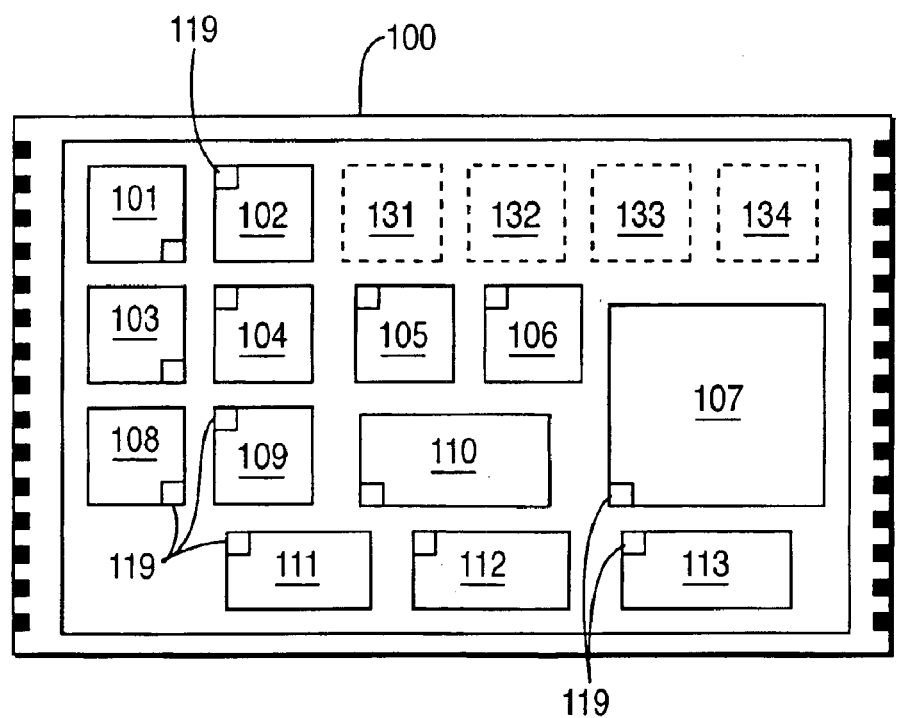
FIG. 2 is a top view of a multi chip module, schematically showing the use of RF transceivers to establish communications links between semiconductor dies.

FIG. 2 is top view of a multi-chip module (MCM), in which a semiconductor package 100 is used to hold a plurality of semiconductor dies 101–113. Each die 101–113 may include an RF transceiver 119. The dies 101–113 are each depicted as mounted directly onto a substrate 121 of the MCM 100, although it is one or more of the dies may be positioned in a stacked arrangement. As a result of the direct mounting of the dies 101–113, it is possible to provide direct connections to the mounting substrate 121, and this direct mounting is used for power connections (such as $v_{ss}$, $v_{cc}$). It is also possible to directly connect the signal connections for each individual die 101–113 by use of hardwire techniques. Such connection requires the connection configuration of the dies 101–113 to be established prior to configuring such hardwire connections.

Unused spaces 131–134 are illustratively depicted in the configuration of the MCM 100. It is possible to provide additional dies in those spaces 131–134. The use of RF transceivers permits the additional dies to communicate with the original set of dies 101–113 for which the module 100 was configured, thereby eliminating a requirement to provide separate configurations for the additional dies. The use of RF connections between the dies allows added flexibility in the interaction facilitating more flexible hardware designs. Additionally, the flexible hardware design is more readily software configurable, since the RF connections can be more readily changed than traditional hardware connections. In alternate embodiments, the RF transceivers on the dies can be utilized to provide RF links between multi-chip modules or even single chip modules (module sets). Preferably, the RF transceivers have a limited range to maintain a small footprint and low power consumption.

Accordingly, typically, the modules are in close proximity. However, by sacrificing the small footprint and low power consumption, these distances between the module sets can be increased.

What is claimed is:

1. A package semiconductor product comprising:

a base substrate;

a plurality of semiconductor dies;

an RF transceiver on at least two of the semiconductor dies each of said RF transceivers providing a communication capability with at least one other one of said RF transceivers, and each RF transceiver operatively connected to circuitry on its respective die, wherein the dies having the RF transceivers communicate with at least one other die having said communication capability.

2. The package semiconductor product of claim 1 further comprising the dies positioned in a vertically stacked relationship, with one of said dies in an adjacent relationship with the base substrate.

3. The package semiconductor product of claim 1 wherein at least one of said semiconductor dies includes a hardwire signal connection with the substrate, and at least one other die uses an RF transceiver to communicate with the die having the hardwire connection and thereby establishes a signal to the substrate through the RF transceiver.

4. The semiconductor packaged product of claim 1 further comprising at least two of the semiconductor dies having RF transcievers connected directly to the base substrate.

* * * * *

UNITED STATES PATENT AND TRADEMARK OFFICE
CERTIFICATE OF CORRECTION

PATENT NO. : 6,953,994 B2
DATED : October 11, 2005
INVENTOR(S) : John David Kaewell, Jr.

It is certified that error appears in the above-identified patent and that said Letters Patent is hereby corrected as shown below:

Column 1,
Line 16, before "packages", delete "discreet" and insert -- discrete --.
Line 45, after "thereby", delete "a".

Column 3,
Line 6, after "although", delete "it is".

Column 4,
Line 30, before "connected", delete "transcievers" and insert -- transceivers --.

Signed and Sealed this

Seventh Day of February, 2006

JON W. DUDAS
*Director of the United States Patent and Trademark Office*